United States Patent
Murakami et al.

(10) Patent No.: US 10,483,452 B2
(45) Date of Patent: Nov. 19, 2019

(54) PIEZOELECTRIC FILM AND PIEZOELECTRIC ELEMENT INCLUDING THE SAME

(71) Applicant: FUJIFILM Corporation, Tokyo (JP)

(72) Inventors: Naoki Murakami, Kanagawa (JP); Daigo Sawaki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/208,343

(22) Filed: Dec. 3, 2018

(65) Prior Publication Data

US 2019/0157542 A1   May 23, 2019

Related U.S. Application Data

(63) Continuation of application No. PCT/JP2017/026703, filed on Jul. 24, 2017.

(30) Foreign Application Priority Data

Aug. 31, 2016   (JP) .................. 2016-168901

(51) Int. Cl.
*H01L 41/18*   (2006.01)
*H01L 41/187*   (2006.01)
(Continued)

(52) U.S. Cl.
CPC .......... *H01L 41/1876* (2013.01); *C01F 17/00* (2013.01); *C01G 25/00* (2013.01); *C01G 33/00* (2013.01); *C01G 33/006* (2013.01); *C23C 14/08* (2013.01); *C23C 16/40* (2013.01); *H01L 41/047* (2013.01); *H01L 41/0805* (2013.01);
(Continued)

(58) Field of Classification Search
CPC ... H01L 41/1876; H01L 41/187; C01G 25/00; C01G 33/00; C01G 33/06; C23C 14/08; C01F 17/00
See application file for complete search history.

(56) References Cited

U.S. PATENT DOCUMENTS

2005/0275696 A1   12/2005   Miyazawa et al.
2007/0046734 A1   3/2007   Aoki et al.
(Continued)

FOREIGN PATENT DOCUMENTS

JP   2000-281439 A   10/2000
JP   2005-353755 A   12/2005
(Continued)

OTHER PUBLICATIONS

Lee, W.I., The Characterization and Electrical Properties of Doped PZT Thin Films Prepared by Sol-Gel Processing, 1995, Mat. REs. Soc. Symp. Proc. vol. 361, p. 421-426. (Year: 1995).*
(Continued)

*Primary Examiner* — J. San Martin
(74) *Attorney, Agent, or Firm* — Studebaker & Brackett PC

(57) ABSTRACT

In the piezoelectric film including a perovskite oxide which is represented by General Formula P, $0.1 \leq x \leq 0.3$ and $0 < y \leq 0.49x$ are satisfied, $A_{1+\delta}[(Zr,Ti)_{1-x-y}Nb_xSc_y]O_z$ ... General Formula P, in General Formula P, A is an A-site element primarily containing Pb, $\delta=0$ and $z=3$ are standard values, but $\delta$ and z may deviate from standard values in a range in which a perovskite structure is capable of being obtained.

7 Claims, 2 Drawing Sheets

(51) Int. Cl.
    *C01G 25/00*     (2006.01)
    *C01G 33/00*     (2006.01)
    *C01F 17/00*     (2006.01)
    *C23C 14/08*     (2006.01)
    *H01L 41/09*     (2006.01)
    *H01L 41/316*     (2013.01)
    *C23C 16/40*     (2006.01)
    *H01L 41/047*     (2006.01)
    *H01L 41/08*     (2006.01)

(52) U.S. Cl.
    CPC ............ *H01L 41/09* (2013.01); *H01L 41/187* (2013.01); *H01L 41/316* (2013.01); *C01P 2002/34* (2013.01); *C01P 2002/54* (2013.01); *C01P 2002/72* (2013.01); *C01P 2006/40* (2013.01)

(56) References Cited

U.S. PATENT DOCUMENTS

| | | | |
|---|---|---|---|
| 2007/0215715 A1* | 9/2007 | Fukui | B41J 2/14233 239/102.2 |
| 2009/0026887 A1 | 1/2009 | Fujii et al. | |
| 2014/0004379 A1 | 1/2014 | Eguchi | |

FOREIGN PATENT DOCUMENTS

| | | |
|---|---|---|
| JP | 2007-142261 A | 6/2007 |
| JP | 2009-054994 A | 3/2009 |
| JP | 2012-099636 A | 5/2012 |
| JP | 2013-157479 A | 8/2013 |
| JP | 5367242 B2 | 12/2013 |
| WO | 2012/124409 A1 | 9/2012 |

OTHER PUBLICATIONS

International Search Report issued in PCT/JP2017/026703; dated Sep. 19, 2017.

Written Opinion issued in PCT/JP2017/026703; dated Sep. 19, 2017.

An Office Action issued by the German Patent Office dated Aug. 26, 2019, which corresponds to German Patent Application No. 11 2017 003 384.5 and is related to U.S. Appl. No. 16/208,343; with English language translation.

* cited by examiner

PIEZOELECTRIC FILM AND PIEZOELECTRIC ELEMENT INCLUDING THE SAME

CROSS-REFERENCE TO RELATED APPLICATIONS

This application is a continuation application of International Application No. PCT/JP2017/026703, filed Jul. 24, 2017, the disclosure of which is incorporated herein by reference in its entirety. Further, this application claims priority from Japanese Patent Application No. 2016-168901, filed Aug. 31, 2016, the disclosure of which is incorporated herein by reference in its entirety.

BACKGROUND OF THE INVENTION

1. Field of the Invention

The present invention relates to a lead zirconate titanate-based piezoelectric film, and a piezoelectric element using the piezoelectric film.

2. Description of the Related Art

An actuator including an ink jet recording head is provided with a piezoelectric body having a piezoelectric property that expands and contracts with variation in applied electric field intensity, and a piezoelectric element provided with an electrode that applies an electric field to the piezoelectric body.

In recent years, in order to meet the demand for miniaturization of an apparatus, miniaturization of an actuator in cooperation with a semiconductor process technology such as a microelectromechanical systems (MEMS) technology has proceeded. In the semiconductor process technology, high-precision processing using film formation or photolithography becomes possible. Therefore, there has been actively conducted research on thinning of a piezoelectric body in an actuator.

As a piezoelectric material having high piezoelectric properties, a lead zirconate titanate (PZT)-based perovskite oxide has been widely used due to its performance. It is known that in a case where a PZT-based perovskite oxide piezoelectric film has a morphotropic phase boundary (MPB) composition in which Zr:Ti is near 52:48, the piezoelectric constant and the electromechanical coupling coefficient thereof become maximum, which is appropriate for actuator applications.

In JP2012-099636A, it is described that in a piezoelectric element provided with a piezoelectric thin film having a laminate of a lead titanate layer and a lead zirconate layer, which have columnar structures, the compositions of lead titanate and lead zirconate in the piezoelectric thin film are caused to be MPB compositions, thereby improving piezoelectric properties.

On the other hand, as a technique for improving piezoelectric properties using a method other than that for the formation of the MPB compositions, a PZT-based piezoelectric film is doped with various donor ions having higher valences than those of substituted ions. Since the ionic valence of Zr and Ti in B-site is 4, as donor ions that substitute for B-site elements, B-site elements having an ionic valence of 5 or higher, such as V, Nb, Ta, Sb, Mo, and W have been used. The amount of the donor ions that substitute for the B-site elements can be applied only in a trace amount, and the improvement in the properties cannot be sufficiently exhibited. It was considered that in a case of increasing the amount of elements that substitute for the B site, the crystallization temperature rises to 800° C. or higher, crystals are not properly formed, and the improvement in the properties cannot be realized.

Here, WO2012/124409A proposes a ferroelectric thin film formed by depositing a dielectric material having a perovskite structure on a base body, in which the dielectric material is composed of a composite oxide in which metal materials other than Pb, Zr, and Ti as additives are mixed in PZT, the thin film has layers with different Zr/Ti ratios, a first layer having a small Zr mixing ratio is provided on the base body, and a second layer having a large Zr mixing ratio is provided on the first layer. In this configuration, the quality of crystallinity varies depending on the mixing concentration of the additives, and the crystallinity is improved in a case where the Zr mixing ratio is smaller than a predetermined ratio even in the dielectric material with varying piezoelectric properties, and good piezoelectric properties are exhibited in a case where the Zr mixing ratio increases to about the predetermined ratio. Therefore, the ferroelectric thin film which exhibits predetermined piezoelectric properties with a predetermined thickness can be formed with good crystallinity by combining the first layer having a mixing ratio for good crystallinity with the second layer having a mixing ratio for high piezoelectric properties. That is, a ferroelectric thin film which exhibits high piezoelectric properties is obtained by forming a thin film of the ferroelectric having a two layer structure constituted by the first layer and the second layer with good crystallinity on the base body in which a lower electrode layer is formed on a substrate.

JP2007-142261A proposes a piezoelectric film which is made of at least one of perovskite materials represented by $Pb(Yb_{1/2}Nb_{1/2})O_3$—$PbTiO_3$, $Pb(In_{1/2}Nb_{1/2})O_3$—$PbTiO_3$, $Pb(Yb_{1/2}Ta_{1/2})O_3$—$PbTiO_3$, $Pb(Sc_{1/2}Nb_{1/2})O_3$—$PbTiO_3$, and the like instead of a PZT piezoelectric film in order to have a high piezoelectric constant.

On the other hand, an attempt to dope PZT with Nb at a high concentration has been reported by the inventors. In JP5367242B, a Nb-doped PZT film in which the effect of the addition of donor ions is sufficiently exhibited by controlling film formation conditions in a non-thermal-equilibrium process is described. In JP5367242B, the production of the Nb-doped PZT film having an MPB composition succeeded.

SUMMARY OF THE INVENTION

However, in the ferroelectric thin film of WO2012/124409A, there is a need to form the first layer and the second layer on the base body using target materials with different Zr/Ti ratios in order to change the Zr mixing ratio, and thus the production is complex.

In the technique of JP2007-142261A, it is considered that the crystallinity is maintained by forming a three-layer configuration in which piezoelectric films made of lead titanate, lead zirconate titanate, or lead niobate zirconate titanate are provided on upper and lower layers of the piezoelectric film mentioned above to secure piezoelectric performance, and it remains questionable whether sufficient properties are obtained only by the piezoelectric films of the above chemical formulas.

Furthermore, in JP5367242B, although the improvement in characteristic piezoelectric properties is realized by increasing a Nb doping amount, there is a demand for further improvement in the piezoelectric properties.

The present invention has been made taking the foregoing circumstances into consideration, and an object thereof is to provide a piezoelectric film which can be easily produced and can obtain sufficiently high piezoelectric properties even with a single layer film, and a piezoelectric element using the piezoelectric film.

A piezoelectric film of the present invention is a piezoelectric film comprising: a perovskite oxide which is represented by General Formula P, $$A_{1+\delta}[(Zr,Ti)_{1-x-y}Nb_xSc_y]O_z \qquad \text{General Formula P}$$

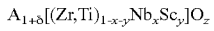

in General Formula P, A is an A-site element primarily containing Pb, $\delta=0$ and $z=3$ are standard values, but $\delta$ and $z$ may deviate from the standard values in a range in which a perovskite structure is capable of being obtained, in which $0.1 \leq x \leq 0.3$ and $0 < y \leq 0.49x$ are satisfied.

In this specification, "A is an A-site element primarily containing Pb" means that a component in a proportion of 90 mol % or more in the A-site element A is Pb.

In the piezoelectric film of the present invention, in General Formula P, $0 < y \leq 0.049$ is preferable, and $0 < y \leq 0.03$ is more preferable.

In the piezoelectric film of the present invention, in General Formula P, $0.1 \leq x \leq 0.2$ is preferable.

In the piezoelectric film of the present invention, it is preferable that the piezoelectric film is a columnar crystal film formed of a number of columnar crystals.

It is preferable that the piezoelectric film of the present invention has a film thickness of 1 μm or greater.

A piezoelectric element of the present invention comprises: the piezoelectric film of the present invention; and an electrode which applies an electric field to the piezoelectric film.

The piezoelectric film of the present invention is the piezoelectric film including the perovskite oxide which is represented by General Formula P, $$A_{1+\delta}[(Zr,Ti)_{1-x-y}Nb_xSc_y]O_z \qquad \text{General Formula P}$$

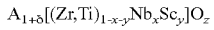

in which the piezoelectric properties can be improved by the configuration satisfying $0.1 \leq x \leq 0.3$ and $0 < y \leq 0.49x$, compared to a PZT-based piezoelectric film which is non-doped with Sc and is doped with Nb. It is possible to obtain sufficient piezoelectric properties with a single layer without configuring the piezoelectric film as a laminated film and the piezoelectric film as the single layer can be easily produced.

DESCRIPTION OF THE PREFERRED EMBODIMENTS

Figure 1:
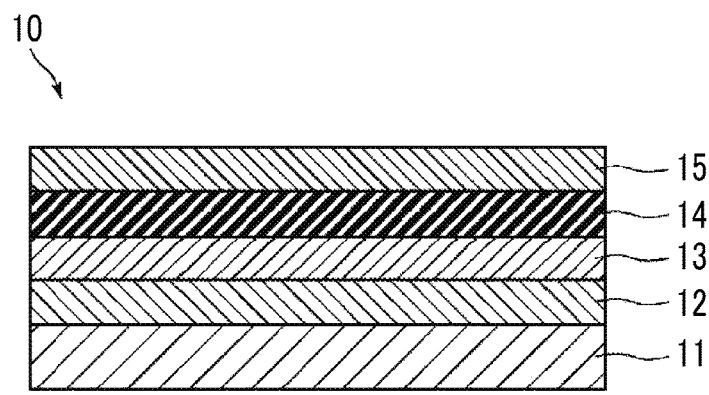
FIG. 1 is a schematic sectional view illustrating an embodiment of a piezoelectric element of the present invention.

As described in "Description of the Related Art", it is known that in a piezoelectric film having a morphotropic phase boundary (MPB) composition in which Zr:Ti is near 52:48 ($0.51 \leq Zr/(Zr+Ti) \leq 0.53$) in a PZT-based perovskite oxide, the piezoelectric constant and the electromechanical coupling coefficient thereof become maximum, which is appropriate for actuator applications. In JP5367242B, it is described that a piezoelectric film with high properties in which a piezoelectric constant $-d_{31}$ measured by a cantilever is 250 pm/V in a Nb-doped PZT film having such a composition is obtained.

The inventors have conducted extensive studies on an element for co-doping PZT with Nb to achieve a further increase in properties. As a result, it was found that by selecting Sc as the co-doping element with Nb, and defining the amounts of Nb and Sc, piezoelectric performance during voltage driving becomes very high.

That is, a piezoelectric film of the present invention is a piezoelectric film comprising: a perovskite oxide which is represented by General Formula P, and $0.1 \leq x \leq 0.3$ and $0 < y \leq 0.49x$ are satisfied, $$A_{1+\delta}[(Zr,Ti)_{1-x-y}Nb_xSc_y]O_z \qquad \text{General Formula P}$$

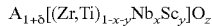

where, in General Formula P, A is an A-site element primarily containing Pb. Although $\delta=0$ and $z=3$ are standard, these values may deviate from standard values in a range in which a perovskite structure is capable of being obtained.

In Formula P, Zr, Ti, Nb, and Sc are B-site elements in a perovskite structure generally represented by $ABO_3$.

The inventors found that, in General Formula P, by causing x representing the Nb content to satisfy $0.1 \leq x \leq 0.3$ and causing y representing the Sc content to satisfy $0 < y \leq 0.49x$, in a Nb-doped PZT-based piezoelectric film, the piezoelectric performance can be improved compared to a case where Sc is not doped (see examples described later). The piezoelectric film having this configuration can be easily produced by adjusting a target composition for the amounts of Nb and Sc, so that film formation is not complex. Furthermore, a Nb and Sc co-doped PZT-based perovskite oxide can realize a film thickness of more than 1 μm.

In particular, in a case where a Sc doping amount satisfies $0 < y \leq 0.049$ or even $0 < y \leq 0.03$, the effect of improving piezoelectricity is high.

The knowledge that the crystallinity of the perovskite structure is enhanced by doping with Sc was obtained from the results of XRD analysis by the inventors, and it is considered that the improvement in the crystallinity is associated with the improvement in piezoelectric performance (see the examples described later).

In addition, it is considered that the improvement in the piezoelectric constant of a Nb-doped PZT piezoelectric film in the related art compared to that of a non-doped PZT piezoelectric film is caused by deviation in the initial position of Ti in a perovskite structure due to doping with Nb and an increase in the amount of movement of Ti during application of an electric field. In the configuration of the present invention, it is presumed that by doping Sc, the deviation in the initial position of Ti is further increased, the amount of movement of Ti during application of an electric field is also increased, and thus a high piezoelectric constant is obtained.

The piezoelectric film of the present invention can be produced by a vapor phase deposition method. The vapor phase deposition method is a method to perform film formation by causing atoms having an energy of an order of magnitude as high as 1 eV to 100 eV emitted from a target or a raw material source to deposit on a substrate. In a case of a PZT-based perovskite oxide film, dopant atoms such as Sc and Nb have high energy and adhere to a film formation substrate or a formed film. Therefore, it is considered that the dopant atoms are more easily incorporated into a PZT perovskite crystal lattice compared to film formation under conditions, which are not in a high-energy environment, such as the sol-gel method.

In the case of the vapor phase deposition method, since the film formation can be performed by the atoms having high energy, the film formation method of the vapor phase deposition method is not particularly limited, and a sputtering method, a plasma chemical vapor phase deposition method (plasma CVD method), a metalorganic chemical vapor phase deposition method (MOCVD method) are preferably exemplified.

Among the vapor phase deposition methods, the sputtering method is preferable because the perovskite oxide film which is formed becomes a film having a columnar crystal film structure consisting of a number of columnar crystals extending in nonparallel to the substrate surface. The growth direction of the columnar crystals may be nonparallel to the substrate surface and may be either a substantially perpendicular direction or an inclined direction. In this film structure, since an oriented film with aligned crystal orientations is obtained, higher piezoelectric performance can be obtained.

At this time, the piezoelectric film has a perovskite structure preferentially oriented in the (100) plane. The term "preferred orientation" refers to a state in which the orientation direction of crystals is not disordered, and a specific crystal plane is oriented in a substantially constant plane. Specifically, "preferentially oriented in the (100) plane" means that the ratio (100)/((100)+(110)+(111)) between the diffraction intensities of the (100) plane, (110) plane, and (111) plane occurring in a case where the piezoelectric film is measured by a wide-angle X-ray diffraction method is greater than 0.5.

The average column diameter of a number of columnar crystals constituting the piezoelectric film is not particularly limited, and is preferably 30 nm or greater and 1 μm or lower. By causing the average column diameter of the columnar crystals to be in this range, favorable crystal growth can be achieved, and a piezoelectric film which can be patterned with high accuracy can be obtained. The average column diameter of the columnar crystals mentioned here means the average value of the column diameters of all the columnar crystals in a horizontal direction at any position in a film thickness direction.

In General Formula P, the ratio between Zr and Ti is not particularly limited as long as both the elements are included. Regardless of the ratio between the two, the effect of improving the piezoelectric properties by doping with Sc in the present invention can be obtained. However, for higher piezoelectric properties to be achieved, an MPB composition (Zr:Ti is 52:48) is preferable.

In addition, although δ is typically 0 as described above. However, since Pb is an element that is likely to be reversely sputtered and an escape of Pb from the formed piezoelectric film has an adverse effect on crystal growth, film formation is performed by setting the amount of Pb in the target to be greater than the stoichiometric composition of PZT. In this case, depending on the reverse sputtering rate of Pb, the formed film may become rich in Pb. As long as there is no hindrance to properties, there is no problem even in a case where Pb deficiency exists. However, by satisfying a range of $0 \leq \delta \leq 0.2$, a perovskite oxide film with good quality and no Pb deficiency can be formed.

A production method of the piezoelectric film of the present invention is not particularly limited as long as film formation is performed by the vapor phase deposition method as described above. However, regarding the temperature Ts of the substrate during the film formation according to the vapor phase deposition method, in a case where the substrate temperature Ts is 400° C. or lower, perovskite crystal growth becomes difficult, and in a case where the substrate temperature Ts is 750° C. or higher, a high temperature pyrochlore phase is likely to be incorporated. Therefore, in order to obtain a columnar crystal film structure with good quality, Ts preferably satisfies $450 \leq Ts$ (° C.)$\leq 650$.

In a case of a vapor phase deposition method using plasma such as a sputtering method, in the range of the substrate temperature Ts, film formation is preferably performed under film formation conditions in which Vs−Vf(V) which is the difference between a plasma potential Vs (V) in plasma during the film formation and a floating potential Vf (V) satisfies Formulas (1) and (2).

$$-0.2Ts+100 < Vs - Vf(V) < -0.2Ts+130 \quad (1)$$

$$10 \leq Vs - Vf(V) \leq 35 \quad (2)$$

"Piezoelectric Element"

The structures of a piezoelectric element 10 of the embodiment according to the present invention will be described with reference to FIG. 1.

The piezoelectric element (ferroelectric element) 10 of the embodiment is an element in which an adhesion layer 12, a lower electrode 13, a piezoelectric film 14, and an upper electrode 15 are sequentially laminated on a substrate 11, and an electric field is applied to the piezoelectric film 14 by the lower electrode 13 and the upper electrode 15 in the thickness direction. The piezoelectric film 14 is the piezoelectric film of the present invention.

Here, the upper and lower sides are defined by defining the substrate 11 side as the lower side and the side far from the substrate 11 side as the upper side with respect to the piezoelectric film 14 as the center.

The substrate 11 is not particularly limited, and examples thereof include substrates of silicon, glass, stainless steel (SUS), yttrium-stabilized zirconia (YSZ), alumina, sapphire, and silicon carbide. As the substrate 11, a laminated substrate such as an SOI substrate in which a $SiO_2$ oxide film is formed on the surface of a silicon substrate may be used. In the embodiment, the adhesion layer 12 is provided between the substrate 11 and the lower electrode 13 for improving the adhesion therebetween, but a buffer layer for improving lattice matching may be provided instead of the adhesion layer or together with the adhesion layer.

As the adhesion layer 12, Ti, TiW, or the like can be used.

The lower electrode 13 is an electrode for applying a voltage to the piezoelectric film. The primary component of the lower electrode 13 is not particularly limited, and examples thereof include metals or metal oxides such as Au, Pt, Ir, $IrO_2$, $RuO_2$, $LaNiO_3$, and $SrRuO_3$, and combinations thereof. It is particularly preferable to use Ir as the lower electrode 13.

The upper electrode 15 forms a pair with the lower electrode 13 and is an electrode for applying a voltage to the piezoelectric film 14. The primary component of the upper electrode 15 is not particularly limited, and examples thereof include the materials exemplified for the lower electrode 13, electrode materials generally used in semiconductor processes such as Al, Ta, Cr, and Cu, and combinations thereof.

The thickness of the lower electrode 13 and the upper electrode 15 is not particularly limited and is preferably 50 to 500 nm, and for example, about 200 nm. The film thickness of the piezoelectric film 14 is not particularly limited, and is usually 1 μm or greater, and for example 1 μm to 5 μm. The film thickness of the piezoelectric film 14 is preferably 2 μm or greater.

With the piezoelectric element having this configuration, since the piezoelectric film can be greatly displaced by applying a voltage between the upper and lower electrodes, the piezoelectric element is suitable as a piezoelectric actuator mounted in an ink jet recording head, a magnetic recording and reproducing head, a microelectromechanical systems (MEMS) device, a micropump, an ultrasound probe, or the like.

EXAMPLES

Examples according to the present invention will be described.

Production of Examples and Comparative Examples

As a film formation substrate, a substrate with an electrode, in which a 10 nm-thick Ti adhesion layer and a 300 nm-thick Ir lower electrode were sequentially laminated on a 25 mm square silicon on insulator (SOI) substrate, was prepared. In the substrate, for evaluation of a piezoelectric constant, a region (cantilever formation region) capable of being evaluated by a cantilever was provided in advance.

The substrate with an electrode was placed in an RF (high frequency) sputtering apparatus, and under conditions with a degree of vacuum of 0.3 Pa and an Ar/O$_2$ mixed atmosphere (O$_2$ volume fraction 2.0%), and a substrate temperature of 450° C., by using targets of each of examples and comparative examples, film formation of a piezoelectric film with a thickness of 3.0 μm was performed. As the target, a single target was used for each example.

As targets of Comparative Examples 1, 2, and 3, those having a target composition satisfying Zr/(Zr+Ti)=0.52, a Nb doping amount in B-site of 10%, 20%, and 30% (all are content ratios in B-site), and no Sc doped were prepared.

As targets of other examples and comparative examples, a plurality of targets having a target composition satisfying Zr/(Zr+Ti)=0.52, a Nb doping amount in B-site of 10%, 20%, and 30%, and different Sc doping amounts were prepared. In this specification, the unit of the doping amount is merely represented by %, but the doping amount in this specification means all mol %.

Figure 2:
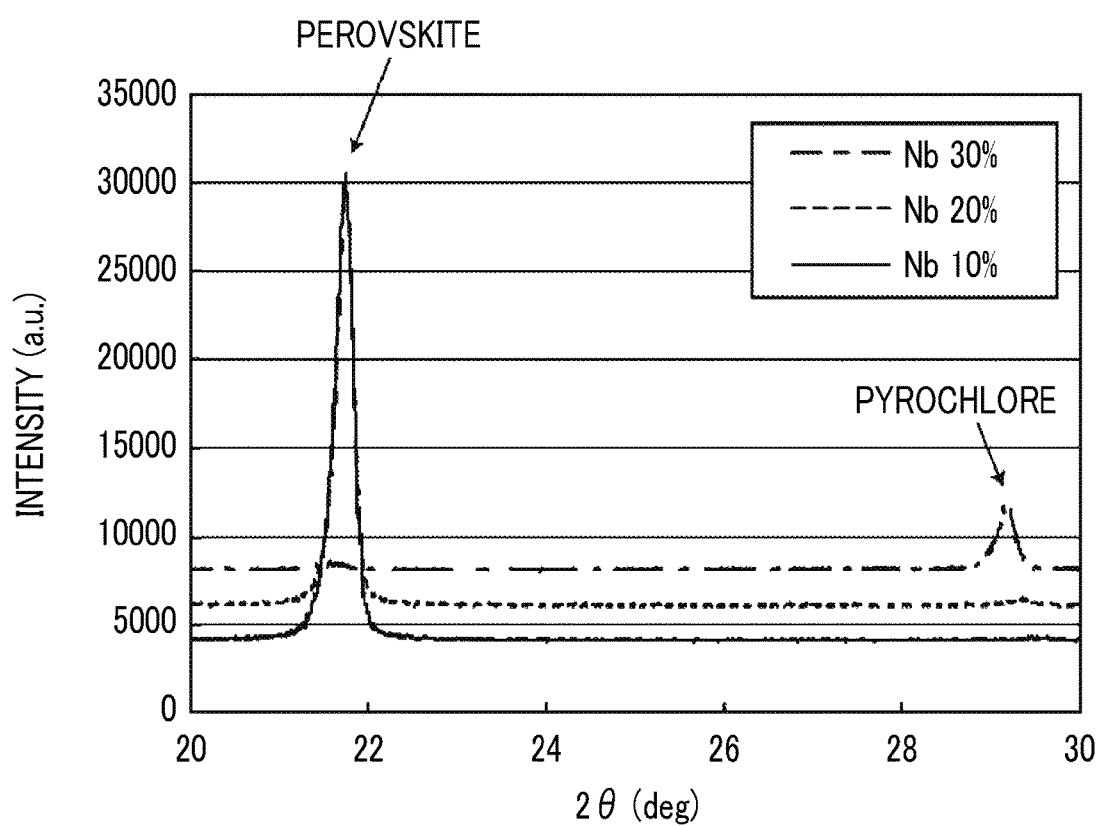
FIG. 2 is a diagram showing X-ray diffraction (XRD) spectra of Nb-doped PZT films having a Nb doping concentration of 10%, 20%, and 30%.

FIG. 2 shows the XRD measurement results of formed Nb-doped PZT films with no Sc (Comparative Example 1: Nb 10%, Comparative Example 2: Nb 20%, and Comparative Example 3: Nb 30%). As shown in FIG. 2, it was confirmed that the Nb-doped PZT films containing no Sc and having a Nb doping amount of 10% and 20% were high-quality (100)-oriented perovskite oxides with no pyrochlore phase, but it was confirmed that pyrochlore crystals were primarily formed in a Nb-doped PZT film having a Nb doping amount of 30%.

XRD measurement was performed on the examples of formed Nb and Sc co-doped PZT films, and it was confirmed that while the (100) peak intensity once increased as the amount of Sc increases, the peak intensity turns to a decrease as the Sc doping amount was further increased. In addition, in a case of a Nb doping amount of 30%, the peak of the pyrochlore phase was confirmed without the addition of Sc, while the peak of the perovskite structure could be rarely observed. However, it was confirmed that by doping with Sc, the peak of the perovskite structure appeared and the peak of the pyrochlore phase decreased. As described above, in a case of a Nb doping amount of 10% to 30%, the crystallinity as a perovskite structure tends to be improved by doping with a trace amount of Sc.

Compositional analysis was performed on the obtained Nb and Sc co-doped PZT films through X-ray fluorescence (XRF). As a result, Pb in the film had a Pb/(Zr+Ti+Nb+Sc) of 1.00 to 1.20. The amount of Sc in each of the examples and comparative examples was as shown in Table 1. According to the XRF results, the amount of Nb in the film was almost equal to the Nb doping amount in the target. However, there may be cases where the amount of Nb in the film deviates within a range of 10% with respect to the target composition, and in the present invention, an error of about 10% regarding the amount of Nb is accepted.

<Displacement Amount Evaluation>

Regarding each of the examples and comparative examples, a 300 nm-thick Pt upper electrode was formed on the Nb-doped PZT film, thereby producing a piezoelectric element. By processing the cantilever formation region into a strip shape having a width of about 2 mm and a length of about 24 mm, cantilevers were produced. In addition, the longitudinal direction of the cantilever was caused to correspond to a (110) direction of crystals of a Si wafer, and the thickness direction thereof was caused to correspond to a (100) direction.

After the cantilever was fixed to cause the displaceable length of the cantilever to be about 18 mm, a sine wave drive voltage of a frequency of 1 kHz, 20 Vpp, and an offset voltage of −10 V was applied between the upper electrode and the lower electrode. A displacement amount was obtained by measuring a tip end displacement amount in a case where the sine wave drive voltage was applied, using a laser doppler vibrometer. Vpp refers to the potential difference between the highest value and the lowest value of an AC voltage waveform.

First, using a finite element method, a resonant frequency was calculated by changing the length of the cantilever, and an effective length $L_0$ was determined by matching the resonant frequency to an actual measurement value. Next, the tip end displacement amount was calculated by setting the length $L_0$, a piezoelectric constant −d31 was obtained in a case where the tip end displacement amount was matched to an actual measurement value, and this was determined as the piezoelectric constant of a PZT-based thin film. A structure used in the finite element method was Pt (0.3 μm)/PZT/Ir (0.3 μm)/Si, and the following values were used as parameter values. In addition, since Si is an anisotropic material, a Young's modulus and a Poisson's ratio used in a simulation calculation need to correspond to the orientation of the cantilever longitudinal direction.

Si (110) orientation: Young's modulus $Y_{Si}$=169 GPa, Poisson's ratio $\sigma_{Si}$=0.064

PZT: Young's modulus $Y_{PZT}$=50 GPa, Poisson's ratio $\sigma_{PZT}$=0.34

Ir (lower electrode): Young's modulus $Y_{Ir}$=530 GPa, Poisson's ratio $\sigma_{Ir}$=0.26

Pt (upper electrode): Young's modulus $Y_{Pt}$=168 GPa, Poisson's ratio $\sigma_{Pt}$=0.39

Table 1 summarizes the Nb doping amount, the Sc doping amount, and the piezoelectric constant −d31 of each of the examples and comparative examples.

TABLE 1

|  | Nb doping amount (%) B site ratio | Sc doping amount (%) B site ratio | −d31 (pm/V) |
|---|---|---|---|
| Comparative Example 1 | 10 | 0 | 225 |
| Example 1-1 | 10 | 1 | 280 |

TABLE 1-continued

| | Nb doping amount (%) B site ratio | Sc doping amount (%) B site ratio | $-d_{31}$ (pm/V) |
|---|---|---|---|
| Example 1-2 | 10 | 2.5 | 260 |
| Example 1-3 | 10 | 3.6 | 244 |
| Example 1-4 | 10 | 4.9 | 228 |
| Comparative Example 1-1 | 10 | 5.2 | 217 |
| Comparative Example 1-2 | 10 | 7.8 | 200 |
| Comparative Example 1-3 | 10 | 10.3 | 180 |
| Comparative Example 2 | 20 | 0 | 250 |
| Example 2-1 | 20 | 1.2 | 303 |
| Example 2-2 | 20 | 4.2 | 282 |
| Example 2-3 | 20 | 5.2 | 275 |
| Example 2-4 | 20 | 9.7 | 262 |
| Comparative Example 2-1 | 20 | 10.2 | 248 |
| Comparative Example 2-2 | 20 | 15 | 230 |
| Comparative Example 3 | 30 | 0 | 38 |
| Example 3-1 | 30 | 1.1 | 200 |
| Example 3-2 | 30 | 6.1 | 150 |
| Example 3-3 | 30 | 8.3 | 101 |
| Example 3-4 | 30 | 14.7 | 42 |
| Comparative Example 3-1 | 30 | 15.3 | 33 |

Figure 3:
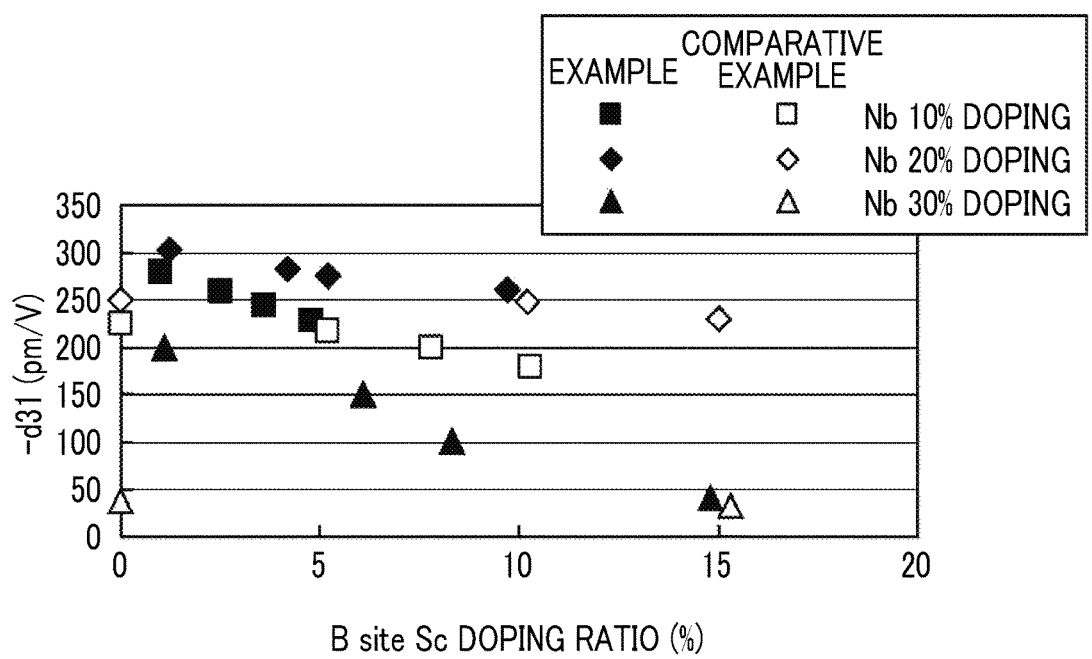
FIG. 3 is a diagram showing the relationship between the $-d_{31}$ constant value and the Sc doping amount of Nb and Sc co-doped PZT films.

FIG. 3 is a graph showing the relationship between the Sc doping amount and the piezoelectric constant $d_{31}$ during driving at an application voltage of 20 Vpp (an offset voltage of −10 V) in each of PZT films with a Nb doping amount of 10%, 20%, and 30%, based on Table 1. In FIG. 3, markers respectively indicating the examples are painted, and markers respectively indicating the comparative examples are plotted in white.

As shown in 3, it was confirmed that regardless of the Nb doping amount, by doping with a trace amount of Sc, the piezoelectric constant is improved compared with a case without Sc doping, but the piezoelectric constant decreases inversely as the doping amount increases. It is considered that in a case of a too large Sc doping amount, Sc was not taken into the crystals but segregated, resulting in deterioration in piezoelectric performance.

In the examples of the present invention in which the Sc doping amount satisfies 0<y≤0.49x, the piezoelectric performance is improved compared to non-doping. In addition, regardless of the amount of Nb, the effect of improving the piezoelectric performance was high in a case where the Sc doping amount was 4.5% or less, 3% or less, and particularly in a range of 1%±0.5%.

In Comparative Example 3 with doping with 30% of Nb and no doping with Sc, the piezoelectric performance was very low, but a significant improvement in the piezoelectric performance could be seen by doping with only 1.1% of Sc. In a case where the XRD observation results are examined together, it is considered that the perovskite structure could be formed even in a case of doping with 30% of Nb by doping with 1.1% of Sc, and thus the piezoelectric properties were dramatically improved.

As described above, in the Nb and Sc co-doped PZT films, the result that the amount of Nb is preferably 10% to 20% as the absolute value of the piezoelectric performance was obtained. On the other hand, in comparison to non-doping, the result that the effect of improving piezoelectric properties by doping with Sc is significant in a case where the amount of Nb is as large as 20% to 30% was obtained.

EXPLANATION OF REFERENCES

10: piezoelectric element
11: substrate
12: adhesion layer
13: lower electrode
14: piezoelectric film
15: upper electrode

What is claimed is:

1. A piezoelectric film comprising:
a perovskite oxide which is represented by General Formula P, $$A_{1+\delta}[(Zr,Ti)_{1-x-y}Nb_xSc_y]O_z \quad \text{General Formula P}$$

in General Formula P, A is an A-site element primarily containing Pb, δ=0 and z=3 are standard values, but δ and z may deviate from the standard values in a range in which a perovskite structure is capable of being obtained,
wherein 0.1≤x≤0.3 and 0<y≤0.49x are satisfied.

2. The piezoelectric film according to claim 1, wherein 0<y≤0.049 is satisfied.

3. The piezoelectric film according to claim 1, wherein 0<y≤0.03 is satisfied.

4. The piezoelectric film according to claim 1, wherein 0.1≤x≤0.2 is satisfied.

5. The piezoelectric film according to claim 1, wherein the piezoelectric film is a columnar crystal film formed of a number of columnar crystals.

6. The piezoelectric film according to claim 1, wherein the piezoelectric film has a film thickness of 1 μm or greater.

7. A piezoelectric element comprising:
the piezoelectric film according to claim 1; and
an electrode which applies an electric field to the piezoelectric film.

* * * * *